United States Patent
Hayakawa et al.

(10) Patent No.: US 9,026,240 B2
(45) Date of Patent: May 5, 2015

(54) SUBSTRATE TREATMENT APPARATUS, METHOD OF TRANSFERRING SUBSTRATE, AND NON-TRANSITORY COMPUTER STORAGE MEDIUM

(75) Inventors: Makoto Hayakawa, Koshi (JP); Hiroshi Tomita, Koshi (JP); Tatsuhei Yoshida, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 490 days.

(21) Appl. No.: 13/281,535

(22) Filed: Oct. 26, 2011

(65) Prior Publication Data

US 2012/0116567 A1    May 10, 2012

(30) Foreign Application Priority Data

Nov. 9, 2010    (JP) .................................. 2010-250909

(51) Int. Cl.

| | |
|---|---|
| *G06F 19/00* | (2011.01) |
| *G06F 17/50* | (2006.01) |
| *G06F 11/00* | (2006.01) |
| *G06F 7/02* | (2006.01) |
| *H01L 21/67* | (2006.01) |
| *H01L 21/677* | (2006.01) |

(52) U.S. Cl.
CPC .... *H01L 21/67288* (2013.01); *H01L 21/67178* (2013.01); *H01L 21/67276* (2013.01); *H01L 21/67745* (2013.01)

(58) Field of Classification Search
USPC ........ 700/105; 716/51; 714/1, 25, 37, 48, 819
See application file for complete search history.

(56) References Cited

U.S. PATENT DOCUMENTS 3,781,117 A * 12/1973 Laycak et al. ................. 356/430
4,618,938 A * 10/1986 Sandland et al. ............. 382/148

(Continued)

FOREIGN PATENT DOCUMENTS

| JP | 2006-277298 A | 10/2006 |
|---|---|---|
| JP | 2007-194262 A | 8/2008 |

(Continued)

OTHER PUBLICATIONS

Pepper et al., "Inline Automated Defect Classification: a Novel Approach to Defect Management", IEEE, 2005, p. 1-6.*

(Continued)

*Primary Examiner* — Robert Fennema
*Assistant Examiner* — Thomas Stevens
(74) *Attorney, Agent, or Firm* — Posz Law Group, PLC

(57) ABSTRACT

A coating and developing treatment apparatus includes a substrate transfer mechanism; and a defect inspection section. A transfer control part controls transfer of a substrate. A defect classification part classifies a defect based on the state of the defect. A storage part stores a transfer route of the substrate by the substrate transfer mechanism when the substrate has been treated by treatment sections. A defective treatment specification part specifies, based on a kind of the defect classified by the defect classification part and the transfer route of the substrate stored in the storage part, a treatment section which is a cause of occurrence of the classified defect, and judges presence or absence of an abnormality of the specified treatment section. The transfer control part controls the substrate transfer mechanism to transfer a substrate bypassing the treatment section which has been judged to be abnormal by the defective treatment specification part.

7 Claims, 12 Drawing Sheets

(56) References Cited

U.S. PATENT DOCUMENTS

| | | | |
|---|---|---|---|
| 4,771,468 A * | 9/1988 | Batchelder et al. | 382/149 |
| 5,086,397 A * | 2/1992 | Schuster et al. | 700/110 |
| 5,210,041 A * | 5/1993 | Kobayashi et al. | 438/7 |
| 5,440,649 A * | 8/1995 | Kiyasu et al. | 382/147 |
| 5,539,752 A * | 7/1996 | Berezin et al. | 714/724 |
| 5,801,965 A * | 9/1998 | Takagi et al. | 702/35 |
| 5,838,567 A * | 11/1998 | Boggio, Jr. | 700/121 |
| 5,910,895 A * | 6/1999 | Proskauer et al. | 700/121 |
| 6,021,512 A * | 2/2000 | Lattimore et al. | 714/710 |
| 6,274,895 B1 * | 8/2001 | Fujii et al. | 257/207 |
| 6,449,749 B1 * | 9/2002 | Stine | 716/56 |
| 6,539,106 B1 * | 3/2003 | Gallarda et al. | 382/149 |
| 6,566,017 B1 * | 5/2003 | Chen et al. | 430/5 |
| 7,068,834 B1 * | 6/2006 | Ikeda et al. | 382/145 |
| 8,025,542 B2 * | 9/2011 | Birrell et al. | 445/24 |
| 8,428,336 B2 * | 4/2013 | Ikeda et al. | 382/144 |
| 2001/0010364 A1 * | 8/2001 | Lee et al. | 250/584 |
| 2001/0026949 A1 * | 10/2001 | Ogawa et al. | 438/15 |
| 2002/0081501 A1 * | 6/2002 | Hasegawa et al. | 430/5 |
| 2002/0088940 A1 * | 7/2002 | Watanabe et al. | 250/310 |
| 2002/0147960 A1 * | 10/2002 | Jevtic et al. | 716/19 |
| 2003/0054573 A1 * | 3/2003 | Tanaka et al. | 438/4 |
| 2003/0086081 A1 * | 5/2003 | Lehman | 356/237.1 |
| 2003/0139055 A1 * | 7/2003 | Hasegawa et al. | 438/725 |
| 2004/0036862 A1 * | 2/2004 | Liang et al. | 356/237.2 |
| 2004/0109598 A1 * | 6/2004 | Weiss et al. | 382/141 |
| 2004/0263194 A1 * | 12/2004 | Ryu et al. | 324/765 |
| 2005/0187648 A1 * | 8/2005 | Tai et al. | 700/110 |
| 2007/0093071 A1 * | 4/2007 | Verhaverbeke et al. | 438/724 |
| 2010/0266195 A1 * | 10/2010 | Iwanaga | 382/149 |
| 2011/0007961 A1 * | 1/2011 | Iwanaga | 382/149 |

FOREIGN PATENT DOCUMENTS

| | | |
|---|---|---|
| JP | A-2009-64934 | 3/2009 |
| JP | A-2009-238992 | 10/2009 |

OTHER PUBLICATIONS

Vachtsevanos et al., "Intelligent Fault Diagnostic and Prognosis for Engineering Systems", 2006, pp. 454.*

Porath et al., "Advanced Process Development and Control Based on a Fully Automated SEM with ADC", ieee, 1999, pp. 275-280.*

* cited by examiner

FIG.7

| wafer num-ber | thermal treatment unite 40 | lower anti-reflection film forming unit 31 | thermal treatment unite 41 | treatment unit and module |||||| |
|---|---|---|---|---|---|---|---|---|---|---|
| | | | | thermal treatment unite 42 | resist coating unit 32 | thermal treatment unite 43 | thermal treatment unite 44 | upper anti-reflection film forming unit 33 | thermal treatment unite 45 |
| 1 | A | F1 | A | A | F2 | A | C | F3 | A |
| 2 | B | F2 | B | B | F3 | B | D | F1 | B |
| 3 | A | F3 | C | A | F1 | C | C | F2 | C |
| 4 | B | F1 | D | B | F2 | D | D | F3 | D |
| 5 | A | F2 | A | A | F3 | A | C | F1 | A |
| 6 | B | F3 | B | B | F1 | B | D | F2 | B |
| 7 | A | F1 | C | A | F2 | C | C | F3 | C |
| 8 | B | F2 | D | B | F3 | D | D | F1 | D |
| 9 | A | F3 | A | A | F1 | A | C | F2 | A |
| 10 | B | F1 | B | B | F2 | B | D | F3 | B |
| 11 | A | F2 | C | A | F3 | C | C | F1 | C |
| . | . | . | . | . | . | . | . | . | . |

| defect clasification | defect occurrence unit |
|---|---|
| Splatters | COT |
| Rings | COT |
| Wedging | OVEN |
| Color fail | COT, DEV |
| Comet | COT |
| Center mode | COT |
| Poor coat | COT |
| EBR shift | COT, EBR |
| EBR cut width | COT, EBR |
| WEE cut width | WEE |
| . | . |
| . | . |
| . | . |
| . | . |

| wafer num-ber | judg-ment | NG judgment process | treatment unit and module | | | | | | | |
|---|---|---|---|---|---|---|---|---|---|---|
| | | | thermal treatment unite 40 | lower anti-reflection film forming unit 31 | thermal treatment unite 41 | thermal treatment unite 42 | resist coating unit 32 | thermal treatment unite 43 | thermal treatment unite 44 | upper anti-reflection film forming unit 33 | thermal treatment unite 45 |
| 1 | OK | | A | F1 | A | A | F2 | A | C | F3 | A |
| 2 | NG | COT | B | F2 | B | B | F3 | B | D | F1 | B |

| wafer num-ber | judg-ment | NG judgment process | treatment unit and module | | | | | | | |
|---|---|---|---|---|---|---|---|---|---|---|
| | | | thermal treatment unit 40 | lower anti-reflection film forming unit 31 | thermal treatment unit 41 | thermal treatment unit 42 | resist coating unit 32 | thermal treatment unit 43 | thermal treatment unit 44 | upper anti-reflection film forming unit 33 | thermal treatment unit 45 |
| | | | | F1 | | | F2 | | | F3 | |
| 1 | OK | | A | | A | A | | A | C | | A |
| 2 | NG | COT | B | F2 | B | B | F3 | B | D | F1 | B |

| wafer number | judgment | NG judgment process | treatment unit and module |||||||||
|---|---|---|---|---|---|---|---|---|---|---|
| | | | thermal treatment unit 40 | lower anti-reflection film forming unit 31 | thermal treatment unit 41 | thermal treatment unit 42 | resist coating unit 32 | thermal treatment unit 43 | thermal treatment unit 44 | upper anti-reflection film forming unit 33 | thermal treatment unit 45 |
| 1 | OK | | A | F1 | A | A | F2 | A | C | F3 | A |
| 2 | NG | COT | B | F2 | B | B | F3 | B | D | F1 | B |
| 3 | OK | | A | F3 | C | A | F1 | C | C | F2 | C |
| 4 | NG | COT | B | F1 | D | B | F2 | D | D | F3 | D |
| 5 | OK | | A | F2 | A | A | F3 | A | C | F1 | A |
| 6 | NG | COT | B | F3 | B | B | F1 | B | D | F2 | B |
| 7 | NG | COT, OVEN | A | F1 | C | A | F2 | C | C | F3 | C |
| 8 | NG | COT, OVEN | B | F2 | D | B | F3 | D | D | F1 | D |
| 9 | NG | COT, OVEN | A | F3 | A | A | F1 | A | C | F2 | A |
| 10 | NG | COT | B | F1 | B | B | F2 | B | D | F3 | B |
| 11 | OK | | A | F2 | C | A | F3 | C | C | F1 | C |

| defect clasification | defect occurrence unit | ON/OFF |
|---|---|---|
| Splatters | COT | ON |
| Rings | COT | OFF |
| Wedging | OVEN | ON |
| Color fail | COT, DEV | ON |
| Comet | COT | ON |
| Center mode | COT | ON |
| Poor coat | COT | OFF |
| EBR shift | COT, EBR | ON |
| EBR cut width | COT, EBR | ON |
| WEE cut width | WEE | ON |
| . | . | . |
| . | . | . |
| . | . | . |
| . | . | . |

206

SUBSTRATE TREATMENT APPARATUS, METHOD OF TRANSFERRING SUBSTRATE, AND NON-TRANSITORY COMPUTER STORAGE MEDIUM

BACKGROUND OF THE INVENTION

1. Field of the Invention

The present invention relates to a substrate treatment apparatus performing treatments of a substrate, a method of transferring the substrate, and a non-transitory computer storage medium.

2. Description of the Related Art

For example, in a photolithography process in manufacturing processes of a semiconductor device, a series of treatments such as resist coating treatment for forming a resist film by applying a resist solution onto a wafer, exposure processing for exposing the resist film to a predetermined pattern, developing treatment for developing the exposed resist film and so on are sequentially performed, whereby a predetermined resist pattern is formed on the wafer. The series of treatments are performed in a coating and developing treatment apparatus being a substrate treatment apparatus in which various kinds of treatment sections treating the wafer and transfer mechanisms transferring the wafer are installed.

Incidentally, a large number of wafers are successively transferred and treated in the above-described coating and developing treatment apparatus, so that when an abnormality occurs, for example, in the coating and developing treatment apparatus, it is necessary to find the abnormality of the apparatus at an early stage. One of inspections for detecting the abnormality of the apparatus is, for example, a surface defect inspection for detecting defects on the wafer surface. Japanese Laid-open Patent Publication No. 2009-64934 suggests a coating and developing treatment apparatus in which a surface defect inspection apparatus performing the surface defect inspection to detect, for example, macro defects is installed.

The wafer for which the series of treatments have been finished is inspected in the surface defect inspection apparatus and evaluated using the inspection result and an abnormality factor analysis function that is a function included in a server as a storage unit disposed outside the coating and developing treatment apparatus. Then, the case that the inspection result is abnormal, namely, it is judged that a defect has occurred on the substrate is coped with, for example, by stopping the operation of the coating and developing treatment apparatus.

Further, in the case that an abnormality has occurred in the coating and developing treatment apparatus and the apparatus is therefore stopped, the productivity decreases more as the stop period becomes longer. Accordingly, to reduce the stop period of the coating and developing treatment apparatus in terms of productivity, it is preferable to quickly specify the cause of occurrence of the abnormality and remove the cause. For this end, Japanese Laid-open Patent Publication No. 2009-238992 suggests that defect models are created by combining a teaching image without defect and defect templates so that the defect on the substrate is classified and specified by comparing the characteristic of the defect on the substrate whose image has been captured to the defect models.

SUMMARY OF THE INVENTION

However, the inspection result over a plurality of lots is required for the aforementioned abnormality factor analysis. Therefore, even if an abnormality occurs during the time when the inspection result over the plurality of lots is collected, a judgment whether an abnormality has occurred or not in a treatment section could not be appropriately made. In this case, the wafer treatment is continuously performed until the judgment of abnormality is made, resulting in production of a large quantity of defective wafers during the period.

The present invention has been made in consideration of the above points and its object is to judge in real time the presence or absence of an abnormality of a treatment section and prevent production of a large quantity of defective wafers.

To achieve the above-described object, the present invention is a substrate treatment apparatus including a plurality of treatment sections treating a substrate, a substrate transfer mechanism transferring the substrate, a defect inspection section inspecting the substrate for which a substrate treatment has been finished for a defect on a surface thereof, and a transfer control means for controlling transfer of the substrate by the substrate transfer mechanism, further including: a defect classification means for classifying the defect based on an inspection result by the defect inspection section; a storage means for storing a transfer route of the substrate by the substrate transfer mechanism when the treatment sections perform the substrate treatment; and a defective treatment specification means for specifying, based on a kind of the defect classified by the defect classification means and the transfer route of the substrate stored in the storage means, a treatment section which is a cause of occurrence of the classified defect, and judging presence or absence of an abnormality of the specified treatment section, wherein the transfer control means controls the substrate transfer mechanism to transfer a substrate bypassing the treatment section which has been judged to be abnormal by the defective treatment specification means.

According to the present invention, it is possible to store a transfer route of the wafer W by the substrate transfer mechanism when the substrate has been treated and specify in real time the treatment section in which the abnormality occurs based on the stored transfer route and a kind of the defect classified by the defect classification means. Then, a substrate is transferred bypassing the specified treatment section, so that it is possible to prevent production of a large quantity of defective products in the wafer treatment thereafter The present invention according to another aspect is a method of transferring a substrate in a substrate treatment apparatus including a plurality of treatment sections treating a substrate, a substrate transfer mechanism transferring the substrate, and a defect inspection section inspecting the substrate for which a substrate treatment has been finished for a defect on a surface thereof, the method including the steps of: storing a transfer route of the substrate by the substrate transfer mechanism when the treatment sections perform the substrate treatment; specifying, based on a kind of the defect classified by the defect detection means and the stored transfer route of the substrate, a treatment section which is a cause of occurrence of the classified defect, and judging presence or absence of an abnormality of the specified treatment section; and then transferring a substrate bypassing the treatment section which has been judged to be abnormal.

The present invention according to still another aspect is a non-transitory computer-readable storage medium storing a program running on a computer of a control unit controlling a substrate treatment apparatus to cause the substrate treatment apparatus to execute a method of transferring a substrate, the substrate treatment apparatus including a plurality of treatment sections treating a substrate, a substrate transfer mechanism transferring the substrate, and a defect inspection section inspecting the substrate for which a substrate treatment has been finished for a defect on a surface thereof, and the method of transferring a substrate including the steps of: storing a transfer route of the substrate by the substrate transfer mechanism when the treatment sections perform the substrate treatment; specifying, based on a kind of the defect classified by the defect detection means and the stored transfer route of the substrate, a treatment section which is a cause of occurrence of the classified defect, and judging presence or absence of an abnormality of the specified treatment section; and then transferring a substrate bypassing the treatment section which has been judged to be abnormal.

According to the present invention, it is possible to judge in real time the presence or absence of an abnormality of a treatment section and prevent production of a large quantity of defective wafers.

BRIEF DESCRIPTION OF THE DRAWINGS

FIG. 7 is an explanatory view exemplifying a transfer route table;

FIG. 9 is an explanatory view exemplifying a defect classification table;

FIG. 10 is an explanatory view exemplifying an abnormal module judgment table;

FIG. 11 is an explanatory view exemplifying the abnormal module judgment table;

FIG. 12 is an explanatory view exemplifying the abnormal module judgment table; and FIG. 13 is an explanatory view exemplifying a defect classification table.

DETAILED DESCRIPTION OF THE INVENTION

Figure 1:
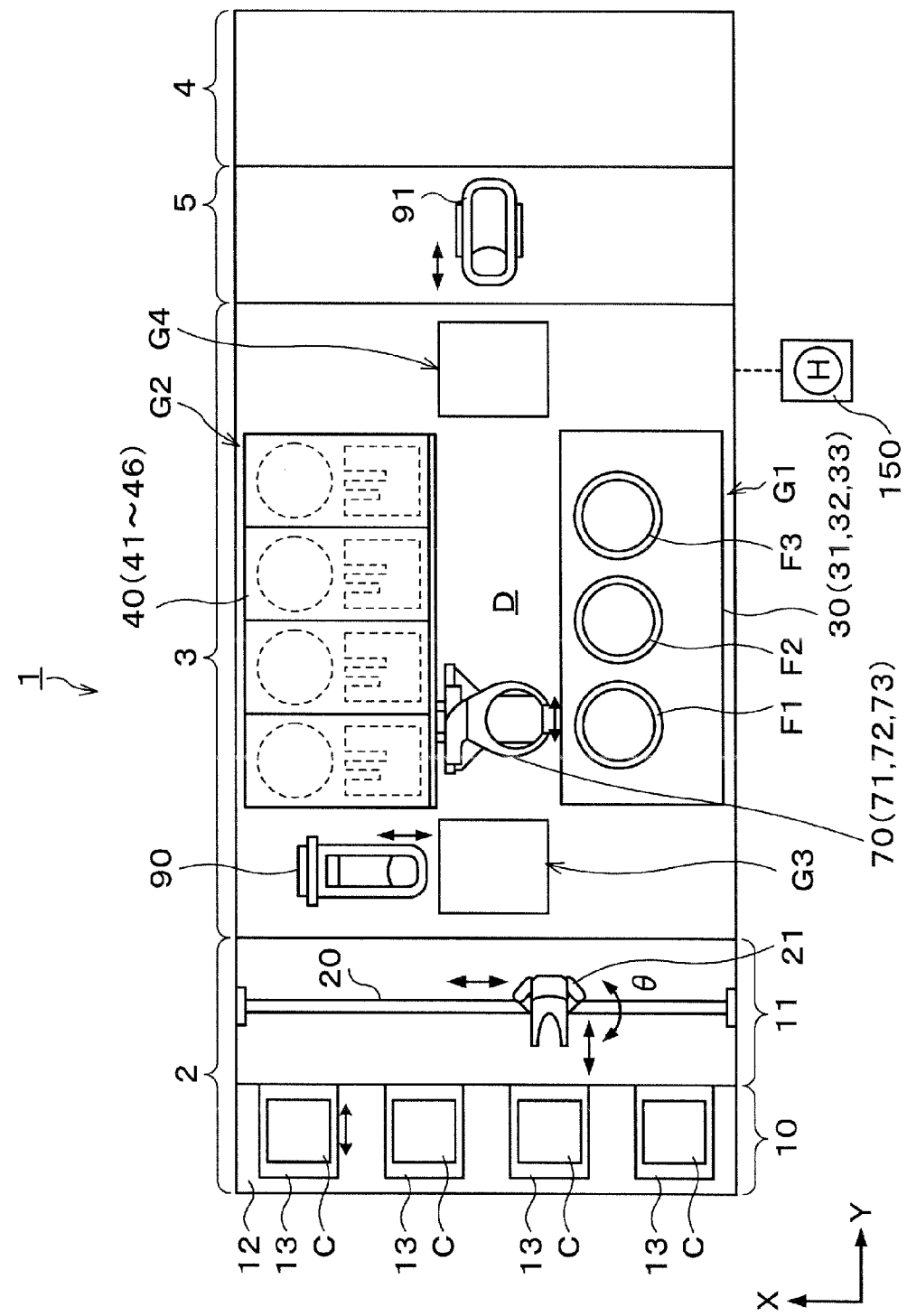
FIG. 1 is a plan view illustrating the outline of the internal configuration of a coating and developing treatment apparatus according to this embodiment.
Figure 2:
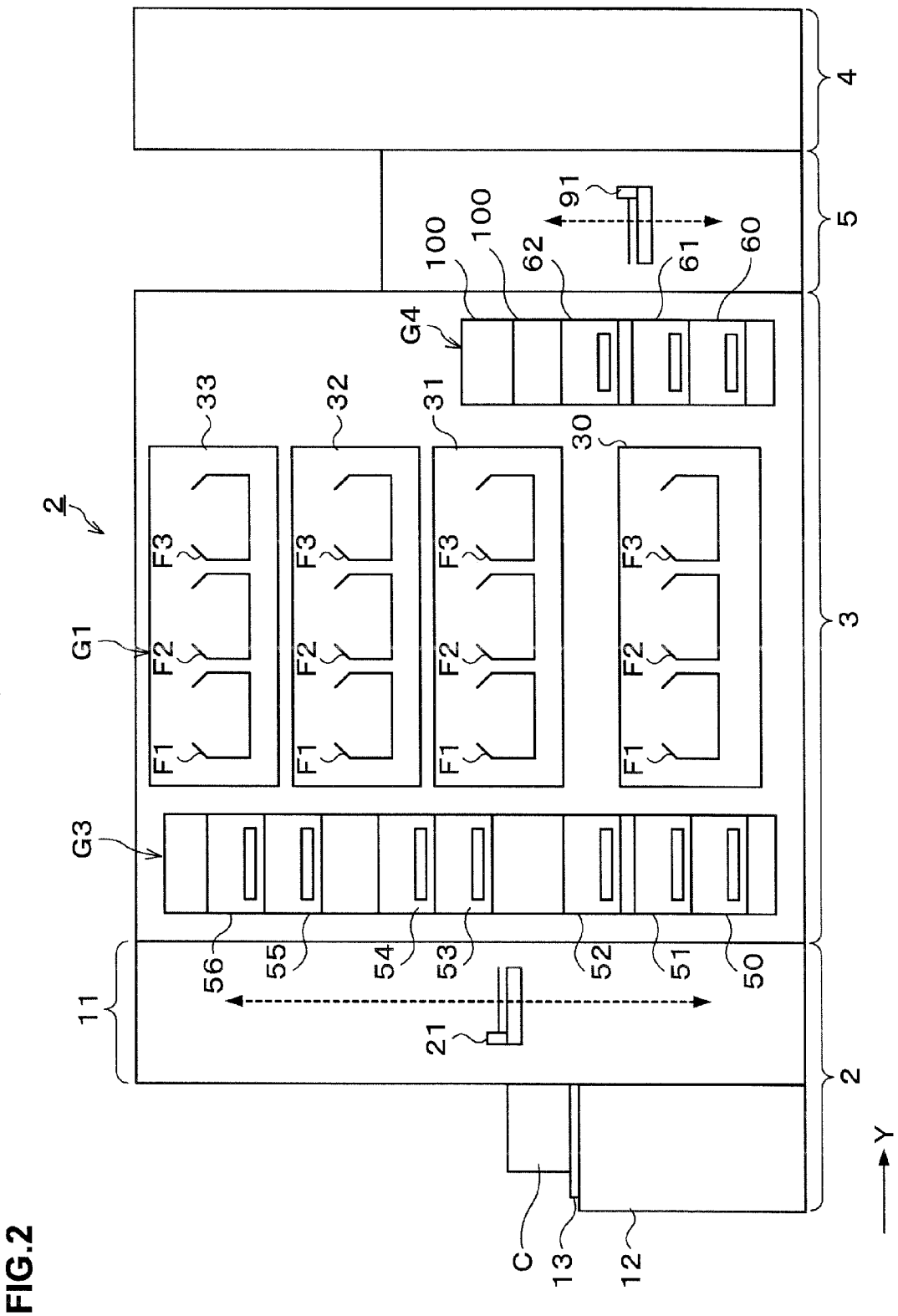
FIG. 2 is a side view illustrating the outline of the internal configuration of the coating and developing treatment apparatus according to this embodiment.
Figure 3:
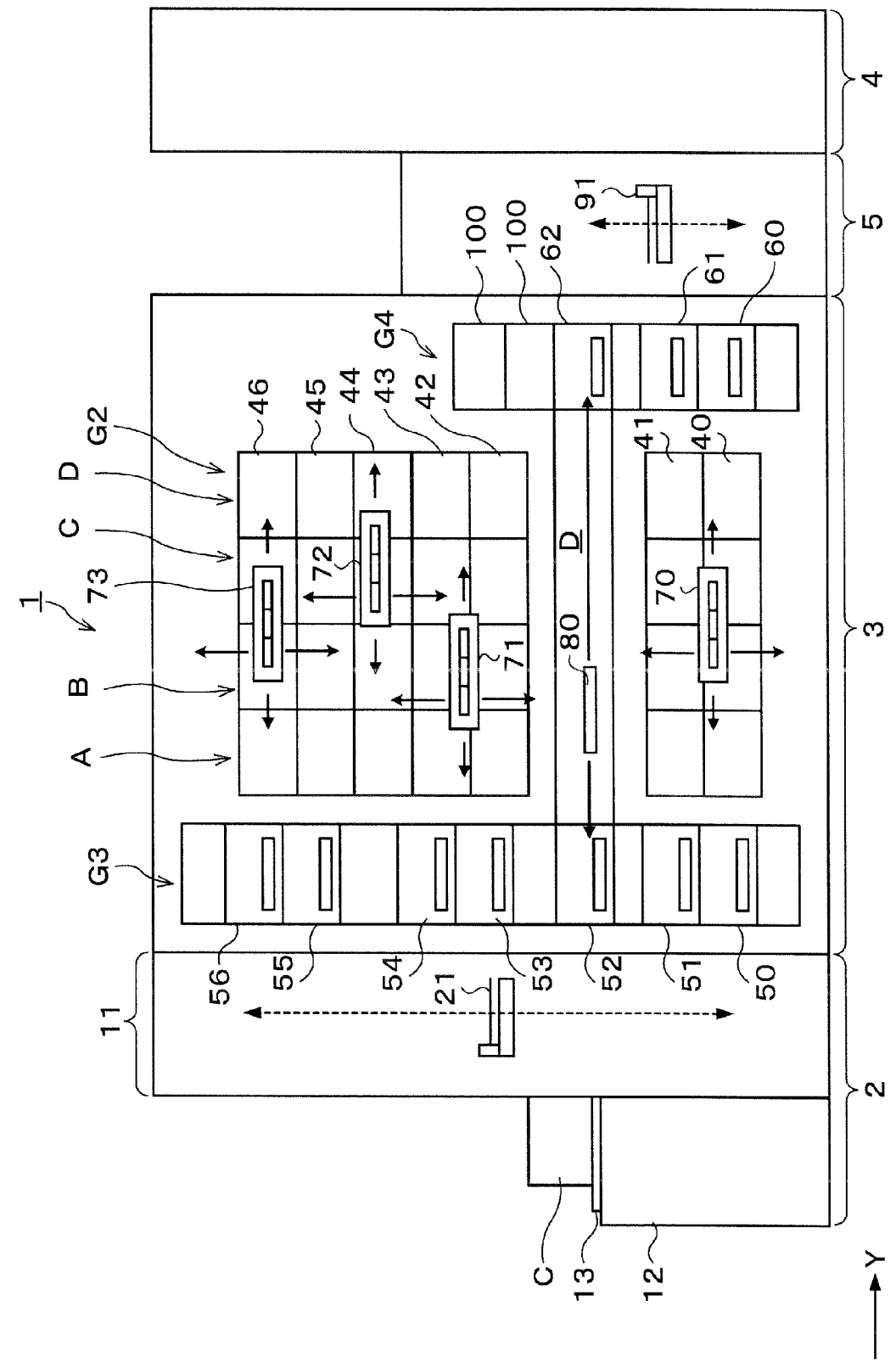
FIG. 3 is a side view illustrating the outline of the internal configuration of the coating and developing treatment apparatus according to this embodiment.

Hereinafter, an embodiment of the present invention will be described. FIG. 1 is an explanatory view illustrating the outline of the internal configuration of a coating and developing treatment apparatus 1 as a substrate treatment apparatus according to this embodiment. FIG. 2 and FIG. 3 are side views illustrating the outline of the internal configuration of the coating and developing treatment apparatus 1.

The coating and developing treatment apparatus 1 has, as illustrated in FIG. 1, a configuration in which, for example, a cassette station 2 to/from which a cassette C housing a plurality of wafers in one lot therein is transferred from/to the outside, a treatment station 3 including a plurality of various kinds of treatment units as treatment sections performing predetermined treatments in a manner of single wafer processing in the photolithography processing, and an interface station 5 for delivering the wafers W to/from an aligner 4 adjacent to the treatment station 3, are integrally connected together. The coating and developing treatment apparatus 1 further include a control section 150 controlling the various treatment units and the like.

The cassette station 2 is divided, for example, into a cassette transfer-in/out section 10 and a wafer transfer section 11. For example, the cassette transfer-in/out section 10 is provided at the end on a Y-direction negative direction (the left direction in FIG. 1) side in the coating and developing treatment apparatus 1. In the cassette transfer-in/out section 10, a cassette mounting table 12 is provided. On the cassette mounting table 12, a plurality of, for example, four mounting plates 13 are provided. The mounting plates 13 are provided side by side in a line in an X-direction (a top-bottom direction in FIG. 1) being the horizontal direction. On the mounting plates 13, cassettes C can be mounted when the cassettes C are transferred from/to the outside of the coating and developing treatment apparatus 1.

In the wafer transfer section 11, a wafer transfer mechanism 21 is provided which is movable on a transfer path 20 extending in the X-direction as illustrated in FIG. 1. The wafer transfer mechanism 21 is movable also in the up and down direction and around a vertical axis (in a O-direction), and can transfer the wafer W between the cassette C on each of the mounting plates 13 and a later-described delivery unit in a third block G3 in the treatment station 3.

In the treatment station 3 adjacent to the cassette station 2, a plurality of, for example, four blocks G1, G2, G3, G4 are provided each including various units. On the front side (an X-direction negative direction side in FIG. 1) in the treatment station 3, the first block G1 is provided. On the rear side (an X-direction positive direction side in FIG. 1) in the treatment station 3, the second block G2 is provided. Further, on the cassette station 2 side (a Y-direction negative direction side in FIG. 1) in the treatment station 3, the third block G3 is provided. On the interface station 5 side (a Y-direction positive direction side in FIG. 1) in the treatment station 3, the fourth block G4 is provided.

For example, in the first block G1, as illustrated in FIG. 2, a plurality of solution treatment units, for example, a developing treatment unit 30 performing developing treatment on the wafer W, a lower anti-reflection film forming unit 31 forming an anti-reflection film under a resist film of the wafer W (hereinafter, referred to as a "lower anti-reflection film"), a resist coating unit 32 applying a resist solution to the wafer W to form a resist film, and an upper anti-reflection film forming unit 33 forming an anti-reflection film over the resist film of the wafer W (hereinafter, referred to as an "upper anti-reflection film"), are four-tiered in order from the bottom.

For example, each of the units 30 to 33 in the first block G1 has, for example, three cups F1, F2, F3 each for housing the wafer W therein in this order from the left side to the right side in the horizontal direction as illustrated in FIG. 2 and can treat a plurality of wafers W in parallel.

For example, in the second block G2, as illustrated in FIG. 3, a plurality of thermal treatment units 40 to 46 are provided each of which performs thermal treatment such as heating and cooling of the wafer W. The thermal treatment units 40 to 46 are tiered in this order from the bottom. The thermal treatment units 40 to 46 provided and tiered as illustrated in FIG. 3 are divided into a thermal treatment module A, a thermal treatment module B, a thermal treatment module C, and a thermal treatment module D in this order from the left side to the right side in the horizontal direction and can individually perform thermal treatment in the thermal treatment modules A to D.

For example, in the third block G3, a plurality of delivery units 50, 51, 52, 53, 54, 55, 56 are provided in order from the bottom.

For example, in the fourth block G4, a plurality of delivery units 60, 61, 62 and defect inspection sections 100, 100 are provided in order from the bottom.

A wafer transfer region D is formed in a region surrounded by the first block G1 to the fourth block G4 as illustrated in FIG. 1. In the wafer transfer region D, for example, wafer transfer mechanisms 70, 71, 72, 73 are provided in order from the bottom as illustrated in FIG. 3. The wafer transfer mechanisms 70, 71, 72, 73 can transfer the wafers W, for example, to predetermined units at the similar levels in the blocks G1 to G4.

Further, in the wafer transfer region D, a shuttle transfer apparatus 80 linearly transferring the wafer W between the third block G3 and the fourth block G4 is provided.

The shuttle transfer apparatus 80 is configured to be linearly movable, for example, in the Y-direction of FIG. 3. The shuttle transfer apparatus 80 can move in the Y-direction while supporting the wafer W and transfer the wafer W between the delivery unit 52 in the third block G3 and the delivery unit 62 in the fourth block G4.

As illustrated in FIG. 1, a wafer transfer mechanism 90 is provided on the X-direction positive direction side of the third block G3. The wafer transfer mechanism 90 has a transfer arm that is movable, for example, in the forward and backward direction, the θ-direction, and the up and down direction. The wafer transfer mechanism 90 can move up and down while supporting the wafer W to transfer the wafer W to each of the delivery units in the third block G3.

In the interface station 5, a wafer transfer mechanism 91 is provided. The wafer transfer mechanism 91 has a transfer arm that is movable, for example, in the forward and backward direction, the θ-direction, and the up and down direction. The wafer transfer mechanism 91 can transfer the wafer W to each of the delivery units in the fourth block G4 and the aligner 4 while supporting the wafer W by the transfer arm.

Next, the configuration of the defect inspection section 100 will be described.

Figure 4:
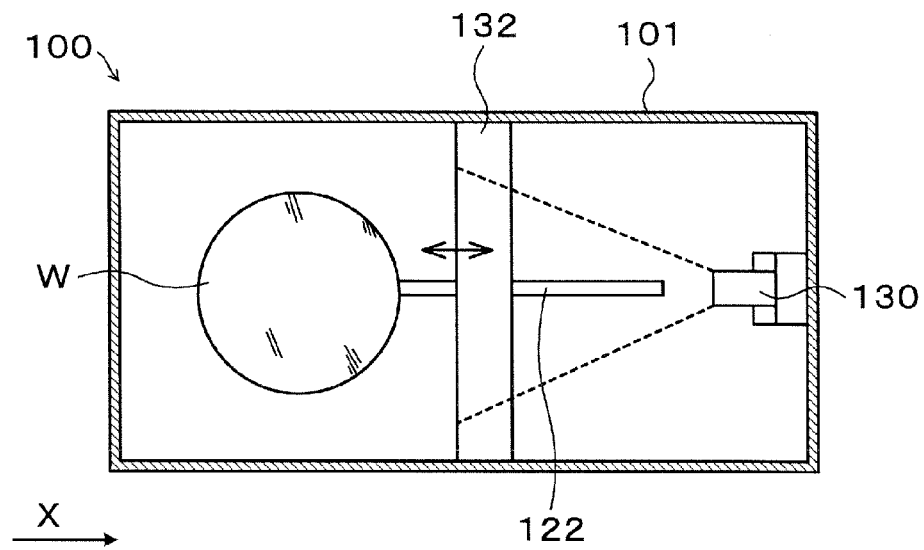
FIG. 4 is a transverse sectional view illustrating the outline of the configuration of a defect inspection apparatus.
Figure 5:
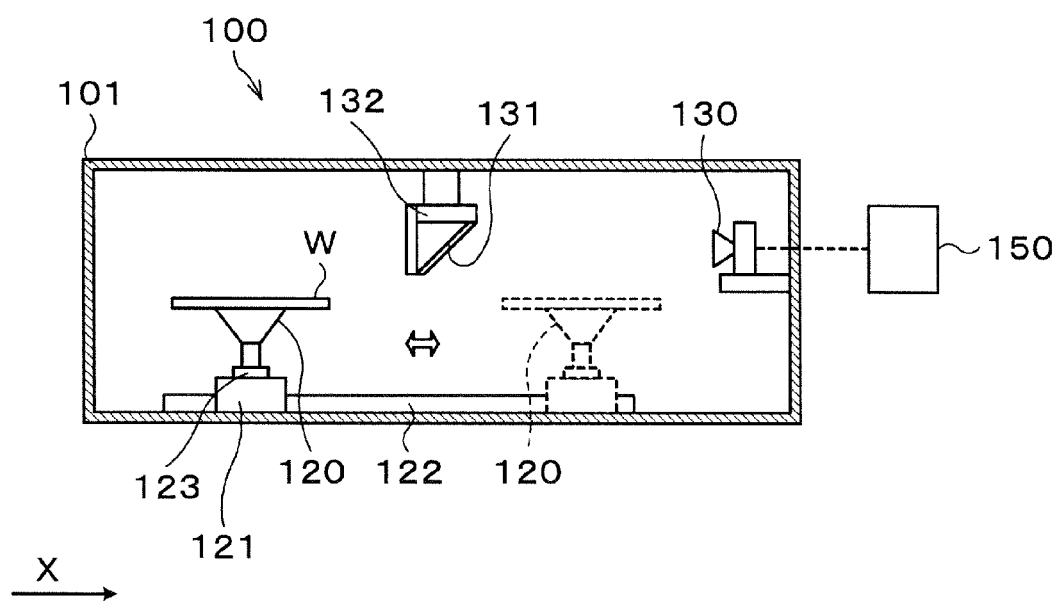
FIG. 5 is a longitudinal sectional view illustrating the outline of the configuration of the defect inspection apparatus.

The defect inspection section 100 has a casing 101 as illustrated in FIG. 4. In the casing 101, a mounting table 120 for mounting the wafer W thereon is provided as illustrated in FIG. 5. The mounting table 120 can freely rotate and stop by means of a rotation drive section 121 such as a motor or the like. On the bottom surface of the casing 101, a guide rail 122 is provided which extends from one end side (an X-direction negative direction side in FIG. 5) to the other end side (an X-direction positive direction side in FIG. 5) in the casing 101. The mounting table 120 and the rotation drive section 121 are provided on the guide rail 122 and can move along the guide rail 122 by means of a drive apparatus 123.

An image capturing apparatus 130 is provided on a side surface on the other end side (the X-direction positive direction side in FIG. 5) inside the casing 101. For the image capturing apparatus 130, for example, a wide-angle CCD camera is used. A half mirror 131 is provided near the middle of the upper portion of the casing 101. The half mirror 131 is provided at a position opposed to the image capturing apparatus 130 in a manner to incline at 45 degrees from the vertical direction. An illumination device 132 is provided above the half mirror 131, and the half mirror 131 and the illumination device 132 are fixed to the upper surface of the casing 101. The illumination from the illumination device 132 passes through the half mirror 131 and is applied downward. Accordingly, light reflected by a body existing below the illumination device 132 is further reflected off the half mirror 131 and is captured into the image capturing apparatus 130. In other words, the image capturing apparatus 130 can capture an image of a body existing in an illumination area by the illumination device 132. The captured inspection object image of the wafer W is then outputted to the control section 150.

Figure 6:
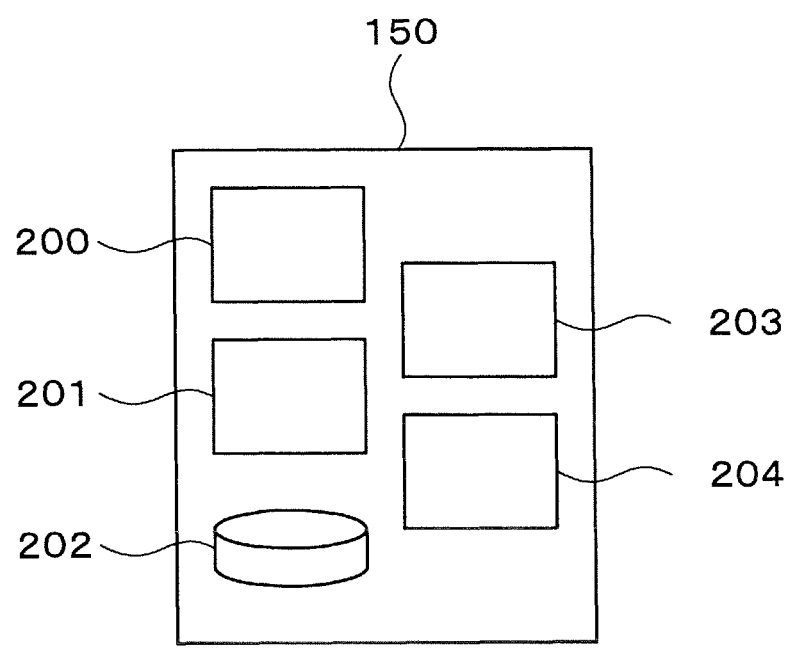
FIG. 6 is an explanatory view illustrating the outline of the configuration of a control section.

The control section 150 has, as illustrated in FIG. 6, a transfer control means 200 for controlling the operations of the wafer transfer mechanisms, a wafer treatment control means 201 for controlling the operations of the various treatment units, a storage means 202 for storing the route in which the wafer W has been transferred by the wafer transfer mechanisms when the wafer has been treated in the treatment units, in other words, the history of the wafer W, that is, by which treatment units the wafer W has been treated, a defect classification means 203 having defect models of the wafer W stored therein and for classifying a defect based on the relation between the defect models and the inspection object image of the wafer W captured by the defect inspection section 100, and a defective treatment specification means 204 for specifying the treatment unit which is the cause of occurrence of the defect.

The storage means 202 stores the transfer routes of wafers W treated by the coating and developing treatment apparatus 1, for example, as a transfer route table 205 as illustrated in FIG. 7. The kinds of the treatment units which have treated the wafers W are listed, for example, from the left side to the right side in the horizontal row in the transfer route table 205 illustrate in FIG. 7, and the numbers of the treated wafers W are listed in order from the top to the bottom in the vertical column. Note that though the case that the wafer W is transferred in order of the thermal treatment unit 40, the lower anti-reflection film forming unit 31, the thermal treatment unit 41, the thermal treatment unit 42, the resist coating unit 32, the thermal treatment unit 43, the thermal treatment unit 44, the upper anti-reflection film forming unit 33, and the thermal treatment unit 45, as the transfer route of the wafer W is indicated in the transfer route table 205 illustrated in FIG. 7, the transfer route of the wafer W is not limited to the contents of this embodiment but may be arbitrarily set.

In each of square portions of the transfer route table 205, the module which has treated the wafer W in each treatment unit is indicated. The module here means each of the cups F1 to F3, for example, in the developing treatment unit 30. The module here means each of the thermal treatment modules A to D in the thermal treatment units 40 to 45.

Figure 8A:
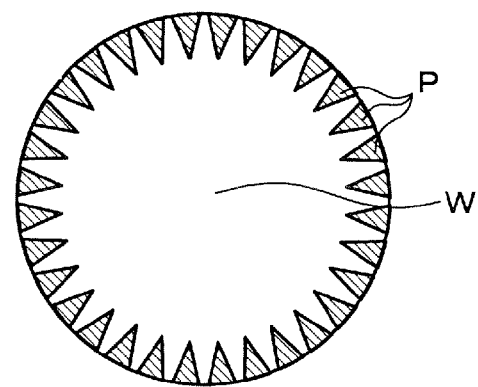
FIGS. 8A to 8C are explanatory views exemplifying classifications of defects, FIG. 8A illustrating the case that splatters have occurred, FIG. 8B illustrating the case that wedging has occurred, and FIG. 8C illustrating the case that rings have occurred.
Figure 8B:
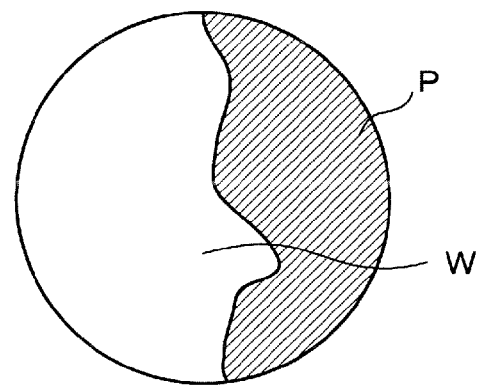
Figure 8C:
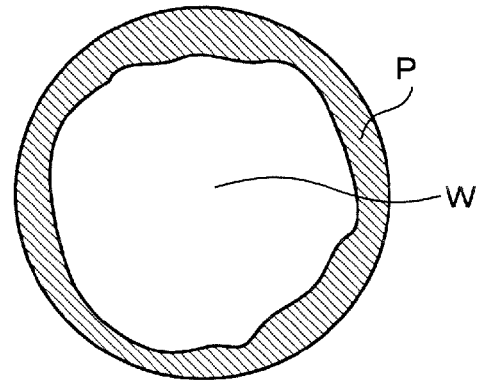

The defect classification means 203 stores in advance defect models, for example, as illustrated in FIGS. 8A to 8C, such as splatters (FIG. 8A) that defects P radially occur at an outer peripheral edge portion of the wafer W, wedging (FIG. 8B) that a defect P occurs only on one side of the wafer W, and rings (FIG. 8C) that an annular defect P occurs at the outer peripheral edge portion of the wafer W. The defect models are created by combining the images of templates simulating defects on the wafer W and the image of a wafer W having no defect. The defect classification means 203 compares the defect models and the inspection object image of the wafer W captured in the defect inspection section 100. Then, a defect model most similar to the inspection object image of the wafer W is classified as the defect on the wafer W. When the inspection object image of the wafer W is not similar to any defect model, it is judged that no defect has occurred on the wafer W.

After the defect classification means 203 classifies the defect, the defective treatment specification means 204 specifies the treatment unit which is the cause of occurrence of the defect. The specification of the treatment unit by the defective treatment specification means 204 will be described.

The defective treatment specification means 204 stores in advance a defect classification table 206 in which the defects classified by the defect classification means 203 are associated with the treatment units which can be causes of occurrence of the defects, for example, illustrated in FIG. 9. Taking the case that the kind of the defect is splatters illustrated in FIG. 8A as an example, the treatment units which can be the cause of occurrence of the splatters include the lower anti-reflection film forming unit 31, the resist coating unit 32, and the upper anti-reflection film forming unit 33. In the defect classification table, the treatment units have been associated in advance as the treatment units corresponding to the splatters. Note that these units of the coating treatment system are collectively indicated as "COT" in FIG. 9. Further, the thermal treatment units 40 to 46 performing various kinds of thermal treatment are indicated as "OVEN" and the developing treatment unit 30 performing developing treatment is indicated as "DEV" in FIG. 9.

In FIG. 9, color fail, comet, center mode, poor coat, EBR shift, EBR cut width, and WEE cut width as well as the above-described splatters, wedging and rings are indicated as the classifications of defects stored in the defect classification table 206, and arbitrary items may be added in the terms of "defect classification" and "defect occurrence unit." Note that the color fail refers to the case that the coating solution is not applied on the wafer W for some reason. The comet refers to the case that a location where the coating film has not been applied occurs due to a foreign matter or the like. The center mode refers to the case that the coating amount of the coating solution at the center portion of the wafer W is non-uniform. The poor coat refers to the case that the coating amount of the coating solution over the entire wafer W is non-uniform. The EBR shift refers to the case that the film removal width (EBR width) at the outer peripheral edge portion of the wafer W is shifted to an arbitrary direction. The EBR cut width refers to the case that the film removal width (EBR width) at the outer peripheral edge portion of the wafer W is abnormal over the entire circumference of the wafer W. The WEE cut width refers to the case that the film exposure width at the outer peripheral edge portion of the wafer W is abnormal over the entire circumference of the wafer W. Further, "EBR" indicated in FIG. 9 represents the edge rinse unit performing rinse at the outer peripheral edge portion of the wafer W, and "WEE" represents the edge exposure unit for the wafer W.

Further, the defective treatment specification means 204 creates an abnormal module judgment table 210 illustrated in FIG. 10 based on the result of the defect classification by the defect classification means 203, the information in the defect classification table 206, and the information in the transfer route table 205. A method of creating the abnormal module judgment table 210 will be described.

For creating the abnormal module judgment table 210, the classification of the defect by the defect classification means 203 is confirmed first for each wafer W whose transfer route is stored in the transfer route table 205. When the defect has been classified to any of the defects, NG is indicted in the box of "judgment" and the information on the treatment unit corresponding to the classification of the defect is read from the defect classification table 206. Then, the kind of the treatment unit which can be the cause of the defect is indicated in the box of "NG judgment process." In the case of no defect, OK is indicated in the box of "judgment" of the abnormal module judgment table 210. In the example illustrated in FIG. 10, the state that the treatments and classification of the defects on the wafers W with wafer numbers of Nos. 1, 2 have been completed is drawn, in which, for example, the wafer W with a wafer number of No. 1 has no defect, and the wafer W with a wafer number of No. 2 has a defect for which COT is indicated in the box of "NG judgment process" as the treatment unit which can be the cause of the defect.

Then, the defective treatment specification means 204 reads the information in the transfer route table 205 from the storage means 202 and indicates the boxes of the lower anti-reflection film forming unit 31, the resist coating unit 32, and the upper anti-reflection film forming unit 33 which are the treatment units corresponding to the COT, for example, in a different color as illustrated in FIG. 11. This operation is continued sequentially on the wafers W, whereby the abnormal module judgment table 210 is sequentially created.

After the abnormal module judgment table 210 is created, when the same module among the modules indicated with diagonal lines is indicated in the different color a predetermined number of times in succession, the defective treatment specification means 204 judges that an abnormality occurs in the module. Concretely, defects occur, for example, three timers in succession in the cup F1 of the lower anti-reflection film forming unit 31, the cup F2 of the resist coating unit 32, and the cup F3 of the upper anti-reflection film forming unit 33, for example, as illustrated in FIG. 12. Accordingly, the defective treatment specification means 204 judges that some abnormalities occur in these modules.

Note that though the example that the transfer route until the thermal treatment is performed after the formation of the upper anti-reflection film is indicated in the abnormal module judgment table 210 in this embodiment, the route indicated in the abnormal module judgment table 210 may be arbitrarily set. Further, though the judgment that the module is abnormal is made when defects have occurred, for example, three times in succession in this embodiment, the number of times of occurrence of defects for judgment of abnormality is not limited to that in this embodiment but may be arbitrarily determined.

After the judgment that some abnormalities have occurred is made as described above, the transfer control means 201 controls the wafer transfer mechanisms so that the treatments of wafers W are performed bypassing the modules which have been judged to be abnormal, in this case, the cup F1 of the lower anti-reflection film forming unit 31, the cup F2 of the resist coating unit 32, and the cup F3 of the upper anti-reflection film forming unit 33. Note that when the module in which an abnormality has occurred is specified, the transfer control means 201 does not conduct control to automatically bypass the specified module but may only notify the occurrence of the abnormality, for example, by issuing an alarm. In this case, the operator confirms the occurrence of the abnormality, and then judges whether to continue the treatments of the wafers W bypassing the module or to stop the coating and developing apparatus 1 and perform restoration operation of the abnormal point.

Note that the above-described control section 150 is composed of a computer including, for example, a CPU and a memory and can execute programs stored, for example, in the memory to implement the coating treatment in the coating and developing treatment apparatus 1. Note that the various programs used for implementing the coating treatment in the coating and developing treatment apparatus 1 are those stored, for example, in a storage medium H such as a computer-readable hard disk (HD), flexible disk (FD), compact disk (CD), magneto-optical disk (MO) or memory card and installed from the storage medium H into the control section 150.

Next, the method of transferring the wafer W performed in the coating and developing treatment apparatus 1 configured as described above will be described together with the processes of the wafer treatment performed in the entire coating and developing treatment apparatus 1. Note that the case that the treatments of the wafer W is performed along the transfer route of the wafer W with a wafer number of No. 1 illustrated in FIG. 7 will be described as an example in the following description.

For the treatments of the wafer W, the cassette C housing a plurality of wafers W therein is mounted on a predetermined mounting plate 13 in the cassette station 10. Then, the wafers W in the cassette C are sequentially taken out by the wafer transfer mechanism 21 and transferred, for example, to the delivery unit 53 in the third block G3 in the treatment station 3.

Then, the wafer W is transferred by the wafer transfer mechanism 71 to the thermal treatment unit 40 in the second block G2 and temperature-regulated. Thereafter, the wafer W is transferred by the wafer transfer mechanism 71, for example, to the lower anti-reflection film forming unit 31 in the first block G1, where a lower anti-reflection film is formed on the wafer W. The wafer W is then transferred to the thermal treatment unit 41 in the second block G2 and subjected to heat treatment. The wafer W is then returned to the delivery unit 53 in the third block G3.

Then, the wafer W is transferred by the wafer transfer mechanism 90 to the delivery unit 54 in the third block G3. Thereafter, the wafer W is transferred by the wafer transfer mechanism 72 to the thermal treatment unit 42 in the second block G2 and temperature-regulated. The wafer W is then transferred by the wafer transfer mechanism 72 to the resist coating unit 32 in the first block G1, where a resist film is formed on the wafer W. The wafer W is then transferred by the wafer transfer mechanism 72 to the thermal treatment unit 43 and subjected to pre-baking. The wafer W is then returned by the wafer transfer mechanism 72 to the delivery unit 55 in the third block G3

Then, the wafer W is transferred by the wafer transfer mechanism 90 to the delivery unit 54 in the third block G3. Thereafter, the wafer W is transferred by the wafer transfer mechanism 73 to the thermal treatment unit 44 in the second block G2 and temperature-regulated. Thereafter, the wafer W is transferred by the wafer transfer mechanism 73 to the upper anti-reflection film forming unit 33 in the first block G1, where an upper anti-reflection film is formed on the wafer W. The wafer W is then transferred to the thermal treatment unit 45 in the second block G2 and subjected to heat treatment. The wafer W is then transferred by the wafer transfer mechanism 73 to the delivery unit 56 in the third block G3.

The wafer W is then transferred by the wafer transfer mechanism 90 to the delivery unit 52 and transferred by the shuttle transfer apparatus 80 to the delivery unit 62 in the fourth block G4. The wafer W is then transferred by the wafer transfer mechanism 91 in the interface station 7 to the aligner 4 and subjected to exposure processing.

The wafer W is then transferred by the wafer transfer mechanism 91 to the delivery unit 60 in the fourth block G4. The wafer W is then transferred by the wafer transfer mechanism 70 to the thermal treatment unit 46 and subjected to post-exposure baking. The wafer W is then temperature-regulated by the thermal treatment unit 45 and then transferred by the wafer transfer mechanism 70 to the developing treatment unit 30 and developed. After the development, the wafer W is transferred by the wafer transfer mechanism 70 to the thermal treatment unit 44 and subjected to post-baking. The wafer W is then temperature-regulated by the thermal treatment unit 43, with which a series of photolithography processes end. In this period, the storage means 202 stores the transfer route of the wafer W in the transfer route table 205 illustrated in FIG. 7 as the transfer route of the wafer W with a wafer number of No. 1.

The wafer W is then transferred by the wafer transfer mechanism 70 to the delivery unit 62 in the fourth block G4. The wafer W is then transferred by the wafer transfer mechanism 91 to the defect inspection section 100, where the wafer W is inspected. The wafer W is then transferred by the wafer transfer mechanism 91 to the delivery unit 62 and transferred to a predetermined mounting plate 13 via the wafer transfer mechanism 70 and the wafer transfer mechanism 21.

Then, the series of photolithography processes and the inspection of the wafer W by the defect inspection section 100 are successively and repeatedly performed. This sequentially updates the abnormal module judgment table 210. Then, when the wafer treatment and the defect inspection are sequentially performed up to the wafer W of No. 10 as illustrated in FIG. 12 and it is judged that, at the point in time, an abnormality has occurred in any of the cup F1 of the lower anti-reflection film forming unit 31, the cup F2 of the resist coating unit 32, and the cup F3 of the upper anti-reflection film forming unit 33, the treatments of wafers W are continuously performed bypassing, for example, the module which has been judged to be abnormal.

According to the above embodiment, the transfer route of the wafer W by the wafer transfer mechanisms when the treatments of the wafer W have been performed by the treatment units is stored, and the abnormal module judgment table 210 is created by the defective treatment specification means 204 based on the stored transfer route and the kind of the defect classified by the defect classification means 203. Thus, it is possible to specify in real time the treatment unit and the module in which the abnormality has occurred using the abnormal module judgment table 210 and perform treatments of wafers W bypassing the specified module. Accordingly, it is possible to prevent production of a large quantity of defective products in the wafer treatment thereafter.

Further, according to the above embodiment, it is possible to easily specify the module in which an abnormality has occurred, based on the abnormal module judgment table 210, and therefore perform the restoration operation in a shorter time.

Further, since the specification of the treatment unit and the module in which an abnormality has occurred is performed by the function included in the control section 150 provided in the coating and developing treatment apparatus 1, it is unnecessary to provide a dedicated server at the outside. Therefore, this also provides an advantage in terms of cost.

Note that though the abnormal module judgment table 210 is created so that when defects have successively occurred on the wafers W treated by a specific module, the module is judged to be abnormal in the above embodiment, the method of judging an abnormality is not limited to this embodiment. It is also adoptable that the defective treatment specification means 204 calculates the rate of occurrence of defects in each module in each treatment unit and when the rate of occurrence of defects exceeds a previously set rate, the module is judged to be abnormal. For calculation of the rate of occurrence of defects, for example, all of the wafers indicated in the abnormal module judgment table 210 may be used as parameters for calculation of the rate. Further, it is also adoptable to set a predetermined number of wafers and calculate the rate of occurrence of defects for the set number of wafers. Further, when the cumulative number of the wafers W on which defects have occurred due to passing through a specific module exceeds a previously set number, the module may be presumed to be abnormal.

Though the abnormality judgment is made based on the number of wafers W on which defects have occurred due to passing through a specific module in the above embodiment, the case that defects have successively occurred on a predetermined number of inspected wafers W may be judged to be abnormal without specifying a module. In this case, the cause of the abnormality relating to a portion common to the modules is presumed, so that the occurrence of defective products can be suppressed by transferring wafers W bypassing the common portion.

Further, the abnormal module may be specified in more detail based on another characteristic amount of the inspection object image of the wafer W in addition to the defect classification table 206. It is possible to judge whether the abnormal module is the lower anti-reflection film forming unit 31 or the upper anti-reflection film forming unit 33, for example, based on color information of the inspection object image.

Though the "NG judgment process" is specified based on the classifications of all defects indicated in the defect classification table 206 in creating the abnormal module judgment table 210 in the above embodiment, it is also adoptable that a predetermined classification among the classifications of defects indicated in the defect classification table 206 is not used for the creation of the abnormal module judgment table 210. In this case, a function is provided which sets whether to use each of the classifications of the defects indicated in the defect classification table 206, for the creation of the abnormal module judgment table 210, for example, as illustrated by "ON/OFF" in FIG. 13.

Further, it is also adoptable to be able to choose between valid or invalid of the function of bypassing the module which has been presumed to be the abnormal module and the function of issuing an alarm.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to this embodiment but can take various forms. The present invention is also applicable to the case that the substrate is other substrates such as an FPD (Flat Panel Display), a mask reticle for a photomask, and the like other than the wafer.

What is claimed is:

1. A substrate treatment apparatus comprising:
  a plurality of treatment modules, including treatment modules of a same kind and treatment modules of different kinds, treating a substrate;
  a substrate transfer mechanism transferring the substrate along one route of a plurality of different transfer routes through the plurality of treatment modules in which each route of the plurality of different transfer routes includes one of the treatment modules of the same kind and at least one of the treatment modules of different kinds;
  a defect inspection section inspecting the substrate for which a substrate treatment has been finished for a defect on a surface thereof; and
  a transfer control means for controlling transfer of the substrate though the plurality of treatment modules along the one route of the plurality of different transfer routes by said substrate transfer mechanism;
  a defect classification means for classifying the defect on the surface of the substrate based on an inspection result by said defect inspection section;
  a storage means for storing the one route of the plurality of different transfer routes along which the substrate is transferred by said substrate transfer mechanism when the one of the treatment modules of the same kind and the at least one of the treatment modules of the different kinds in the one route of the plurality of different transfer routes perform the substrate treatment; and
  a defective treatment specification means for
    creating, in response to a kind of defect classified by said defect classification means, for the substrate for which the substrate treatment has been finished and after the substrate has been inspected by the defect inspection section and after the defect has been classified, an entry in an abnormal judgment table in which kinds of the defects classified by said defect classification means and kinds of treatment modules which are possibly causes of occurrence of the defects are associated with each other,
    specifying, based on the abnormal module judgment table and the one route of the plurality of different transfer routes along which the substrate is transferred that stored the storage means, one of the plurality of treatment modules which is the cause of the occurrence of the defect from among the kinds of the treatment modules which are possibly causes of occurrence of the defect, and
    judging presence or absence of an abnormality of the specified treatment module,
  wherein (A) said transfer control means controls said substrate transfer mechanism to transfer a substrate which is being, transferred through the plurality of treatment modules along the one route of the plurality of different transfer routes so as to use, for the substrate, another treatment module of the same kind as the specified treatment module, instead of using the specified treatment module which has been specified to be the cause of occurrence of the defect and is judged to have the abnormality, when the abnormality of the specified treatment module is judged to be present; and (B) said transfer control means controls said substrate transfer mechanism to transfer the substrate which is being transferred through the plurality of treatment modules along the one route of the plurality of different routes so as to use, for the substrate, the one route of the plurality of different transfer routes without bypass of the specified treatment module, when the abnormality of the specified treatment module is judged to be absent.

2. The substrate treatment apparatus as set forth in claim 1, wherein when defects successively occur in the one of the plurality of treatment modules which is the cause of occurrence of the defect, said defective treatment specification means judges that the one of the treatment modules which is the cause of occurrence of the defect is abnormal.

3. The substrate treatment apparatus as set forth in claim 1, wherein when a rate of occurrence of defects exceeds a previously set rate in the one of the plurality of treatment modules which is the cause of occurrence of the defect, said defective treatment specification means judges that the one of the plurality of treatment modules which is the cause of occurrence of the defect is abnormal.

4. A method of transferring a substrate in a substrate treatment apparatus comprising a plurality of treatment modules, including treatment modules of a same kind and treatment modules of different kinds treating a substrate; a substrate transfer mechanism transferring the substrate along one of a plurality of different transfer routes through the plurality of treatment modules in which each route of the plurality of different transfer routes includes one of the treatment modules of the same kind and at least one of the treatment modules of different kinds; and a defect inspection section inspecting the substrate for which a substrate treatment has been finished for a defect on a surface thereof, said method comprising the steps of:

controlling transfer of the substrate through the plurality of treatment modules along the one route of the plurality of different transfer routes by said substrate transfer mechanism;

classifying the defect on the surface of the substrate based on an inspection result by said defect inspection section;

storing, in a storage means, the one route of the plurality of different transfer routes along which the substrate is transferred by the substrate transfer mechanism when the one of the treatment modules of the same kind and the at least one of the treatment modules of the different kinds in the one route of the plurality of different transfer routes perform the substrate treatment;

creating, in response to a kind of the defect classified, for the substrate for which the substrate treatment has been finished and after the substrate has been inspected by said defect inspection section and after the defect has been classified, an entry in an abnormal judgment table in which kinds of the defects classified by said classifying step and kinds of treatment modules which are possibly causes of occurrence of the defects are associated with each other, specifying, based on the abnormal judgment table and the one route of the plurality of different transfer routes along which the substrate is trans erred that is stored in the storage means, one of the plurality of treatment modules which is the cause of the occurrence of the defect from among the kinds of treatment modules which are possibly causes of occurrence of the defect, and judging presence or absence of an abnormality of the specified treatment module; and then controlling the substrate transfer mechanism to (A) transfer a substrate which is being transferred through the plurality of treatment modules along the one route of the plurality of different transfer routes so as to use, for the substrate, another treatment module of the same kind as the specified treatment module, instead of using the specified treatment module which has been specified to be the cause of occurrence of the defect and is judged to have the abnormality, when the abnormality of the specified treatment module is judged to be present, and (B) transfer the substrate which is being transferred through the plurality of treatment modules along the one route of the plurality of different routes so as to use, for the substrate, the one route of the plurality of different transfer routes without bypass of the specified treatment module, when the abnormality of the specified treatment module is judged to be absent.

5. The substrate treatment method as set forth in claim 4, wherein when defects successively occur in the one of the plurality of treatment modules which has been specified as the cause of occurrence of the defect, the one of the plurality of treatment modules is judged to be abnormal.

6. The substrate treatment method as set forth in claim 4, wherein when a rate of occurrence of defects exceeds a previously set rate in the one of the plurality of treatment modules which has been specified as the cause of occurrence of the defect, the one of the plurality of treatment modules is judged to be abnormal.

7. A non-transitory computer-readable storage medium storing a program running on a computer of a control unit controlling a substrate treatment apparatus to cause the substrate treatment apparatus to execute a method of transferring a substrate, said substrate treatment apparatus comprising a plurality of treatment modules of a same kind and treatment modules of different kinds, treating a substrate; a substrate transfer mechanism transferring the substrate along one route of a plurality of different transfer routes through the plurality of treatment modules in which each route of the plurality of different transfer routes includes one of the treatment modules of the same kind and at least one of the treatment modules of different kinds; and a defect inspection section inspecting the substrate for which a substrate treatment has been finished for a defect on a surface thereof, and said method of transferring a substrate comprising the steps of:

controlling transfer of the substrate through the plurality of treatment modules along the one route of the plurality of different transfer routes by said substrate transfer mechanism;

storing, in a storage means, the one route of the plurality of different transfer routes along which the substrate is transferred by the substrate transfer mechanism when one of the treatment modules of the same kind and the at least one of the treatment modules of the different kinds in the one route of the plurality of different transfer routes perform the substrate treatment;

creating, in response to a kind of the defect classified, for the substrate for which the substrate treatment has been finished and after the substrate has been inspected by said defect inspection section and after the defect has been classified based on an inspection result by the defect inspection section, an entry in an abnormal judgment table in which kinds of the defects classified by classifying the defect based on the inspection result by said defect inspection section and kinds of treatment modules which are possible causes of occurrence of the defects are associated with each other;

specifying, based on the abnormal judgment table and the one route of the plurality of different transfer routes along which the substrate is transferred that is stored in the storage means, one of the plurality of treatment modules which is a cause of the occurrence of the defect from among the kinds of treatment modules which are possible causes of occurrence of the defect;

judging presence or absence of an abnormality of the specified treatment module; and then controlling the substrate transfer mechanism to (A) transfer a substrate which is being transferred through the plurality of treatment modules along the one route of the plurality of different transfer routes so as to use, for the substrate, another treatment module of the same kind as the specified treatment module, instead of using the specified treatment module which has been specified to be the cause of occurrence of the defect and which is judged to have the abnormality, when the abnormality of the specified treatment module is judged to be present; and (B) transfer the substrate which is being transferred through the plurality of treatment modules along the one route of the plurality of different routes so as to use, for the substrate, the one route of the plurality of different transfer routes without bypass of the specified treatment module, when the abnormality of the specified treatment module is judged to be absent.

* * * * *